United States Patent
Kim

(10) Patent No.: US 10,833,139 B2
(45) Date of Patent: Nov. 10, 2020

(54) DISPLAY APPARATUS

(71) Applicant: Samsung Display Co., Ltd., Yongin-Si (KR)

(72) Inventor: Namjin Kim, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/412,772

(22) Filed: May 15, 2019

(65) Prior Publication Data

US 2020/0091256 A1 Mar. 19, 2020

(30) Foreign Application Priority Data

Sep. 14, 2018 (KR) .................. 10-2018-0109965

(51) Int. Cl.
  *H01L 27/32* (2006.01)
  *H01L 51/00* (2006.01)
  *H01L 51/52* (2006.01)

(52) U.S. Cl.
  CPC ...... *H01L 27/3246* (2013.01); *H01L 27/3258* (2013.01); *H01L 51/0097* (2013.01); *H01L 51/5253* (2013.01); *H01L 2251/5338* (2013.01); *H01L 2933/005* (2013.01)

(58) Field of Classification Search
  None
  See application file for complete search history.

(56) References Cited

U.S. PATENT DOCUMENTS

| | | | |
|---|---|---|---|
| 10,014,491 B2 | 7/2018 | Park | |
| 2018/0013081 A1* | 1/2018 | Chou | ................ H01L 51/0516 |
| 2019/0006444 A1* | 1/2019 | Nishimura | .......... H01L 41/0475 |

FOREIGN PATENT DOCUMENTS

| | | |
|---|---|---|
| JP | 3797061 B2 | 7/2006 |
| KR | 1019980013549 A | 4/1998 |
| KR | 1020180062155 A | 6/2018 |

* cited by examiner

*Primary Examiner* — Sonya McCall-Shepard
(74) *Attorney, Agent, or Firm* — Cantor Colburn LLP

(57) ABSTRACT

A display apparatus includes a base layer, on which a display area and a non-display area disposed to surround the display area are defined, a circuit layer disposed on the base layer and including a plurality of insulation layers, a pixel layer disposed on the display area and including a plurality of organic light-emitting diodes, an encapsulation layer disposed on the pixel layer to cover the pixel layer, and a protruding member disposed between the circuit layer and the encapsulation layer on the non-display area. A bank coupling hole is defined in the circuit layer on the non-display area, and the bank coupling hole is defined through at least an uppermost insulation layer of the insulation layers and overlaps the protruding member on a plane.

20 Claims, 14 Drawing Sheets

DISPLAY APPARATUS

This application claims priority to Korean Patent Application No. 10-2018-0109965, filed on Sep. 14, 2018, and all the benefits accruing therefrom under 35 U.S.C. § 119, the content of which in its entirety is herein incorporated by reference.

BACKGROUND

1. Field

The disclosure herein relates to a display apparatus, and more particularly, to a display apparatus with improved durability.

2. Description of the Related Art

In general, a display apparatus includes a display unit disposed on a substrate. In such a display apparatus, at least a portion of the display apparatus may be bent, such that visibility at various angles may improve, or a surface area of a non-display area may decrease.

SUMMARY

In a process of manufacturing a conventional bendable display apparatus, a defect may occur or the display apparatus may decrease in life span such that manufacturing costs may increase.

The disclosure provides a display apparatus with improved durability.

An embodiment of the invention provides a display apparatus including: a base layer, on which a display area and a non-display area surround the display area are defined; a circuit layer disposed on the base layer and including a plurality of insulation layers; a pixel layer disposed on the display area and including a plurality of organic light-emitting diodes; an encapsulation layer disposed on the pixel layer to cover the pixel layer; and a protruding member disposed between the circuit layer and the encapsulation layer on the non-display area. In such an embodiment, a bank coupling hole is defined in the circuit layer on the non-display area, and the bank coupling hole is defined through at least an uppermost insulation layer of the insulation layers and overlaps the protruding member on a plane.

In an embodiment, the protruding member may be provided in plural, and the protruding member may include: a dam disposed to surround the display area; and a bank disposed on an outside of the dam in a first direction, and the bank coupling hole may overlap the bank on the plane.

In an embodiment, the circuit layer may further include: a barrier layer disposed on the base layer; a plurality of thin-film transistors disposed on the barrier layer; and a plurality of conductive patterns disposed on the barrier layer in the non-display area. In such an embodiment, the plurality of insulation layers may include: a plurality of intermediate insulation layers disposed on the barrier layer; and an upper insulation layer disposed on the intermediate insulation layers to cover the thin-film transistors and the conductive patterns.

In an embodiment, the bank coupling hole may be defined through the upper insulation layer to expose a portion of the intermediate insulation layer, and the bank and the intermediate insulation layer may be coupled to each other through the bank coupling hole.

In an embodiment, an encapsulation coupling hole may be defined through at least the upper insulation layer on the non-display area, and the encapsulation coupling hole may be defined between the bank and the dam on the plane.

In an embodiment, the encapsulation coupling hole may be defined through the upper insulation layer and the intermediate insulation layer, and the encapsulation layer, and the barrier layer may be coupled to each other through the encapsulation coupling hole.

In an embodiment, the bank coupling hole may be defined through the upper insulation layer, the intermediate insulation layers and the barrier layer, and the bank and the base layer may be coupled to each other through the bank coupling hole.

In an embodiment, the bank coupling hole may not overlap the conductive patterns on the plane, and be insulated with the conductive patterns.

In an embodiment, the circuit layer may include a dam coupling hole defined through at least the upper insulation layer on the non-display area, and the dam coupling hole may overlap the dam on the plane.

In an embodiment, the dam coupling hole may overlap at least a portion of the conductive patterns on the plane, and be insulated with the conductive patterns.

In an embodiment, the dam coupling hole may be defined through the upper insulation layer and the intermediate insulation layer, and the dam and the barrier layer may be coupled to each other through the dam coupling hole.

In an embodiment, the dam coupling hole may not overlap the conductive patterns on the plane, and be insulated with the conductive patterns.

In an embodiment, the dam may be provided in plural, and the dam may include: a first dam having a frame shape surrounding the display area on the plane; and a second dam having a frame shape surrounding the first dam on the plane, and at least one of the first dam and the second dam may overlap the conductive patterns.

In an embodiment, the non-display area may include a bending area, which is bent with respect to a bending axis perpendicular to the first direction on the plane.

In an embodiment, a distance between the display area and the bending area in the first direction may be about 400 micrometers ($\mu m$) or less.

In an embodiment, the bank coupling hole may have a first directional width of about 5 $\mu m$ or more and about 200 $\mu m$ or less.

In an embodiment, the bank coupling hole may be provided in plural.

In an embodiment, the bank may have a first directional width greater than a first directional width of the dam.

In an embodiment of the invention, a display apparatus includes: a base layer, on which a display area and a non-display area surround the display area are defined; a circuit layer disposed on the base layer; a display layer disposed on the circuit layer; and a plurality of protruding members disposed on the circuit layer on the non-display area. In such an embodiment, the circuit layer includes: a plurality of insulation layers, where a coupling hole is defined through at least one uppermost insulation layer of the insulation layers in the non-display area; and a plurality of conductive patterns disposed between the insulation layers, and at least one of the protruding members is filled in the coupling hole.

In an embodiment of the invention, a display apparatus includes a display panel on which a display area for displaying an image and a non-display area surround the display area are defined, in which at least a portion of the non-display area is bent. In such an embodiment, the display panel includes: a base layer; a circuit layer disposed on the base layer and including a plurality of insulation layers; a pixel layer disposed on the display area; an encapsulation layer disposed on the pixel layer to cover the pixel layer; and a bank disposed between the circuit layer and the encapsulation layer on the non-display area, and a bank coupling hole is defined in the circuit layer on a partial area disposed adjacent to the bending area in the non-display area, in which the bank coupling hole is defined through at least upper insulation layer of the insulation layers, and a lower portion of the bank is filled in the bank coupling hole.

BRIEF DESCRIPTION OF THE DRAWINGS

These and/or other features of the invention will become apparent and more readily appreciated from the following description of the exemplary embodiments, taken in conjunction with the accompanying drawings, in which.

DETAILED DESCRIPTION

Figure 1:
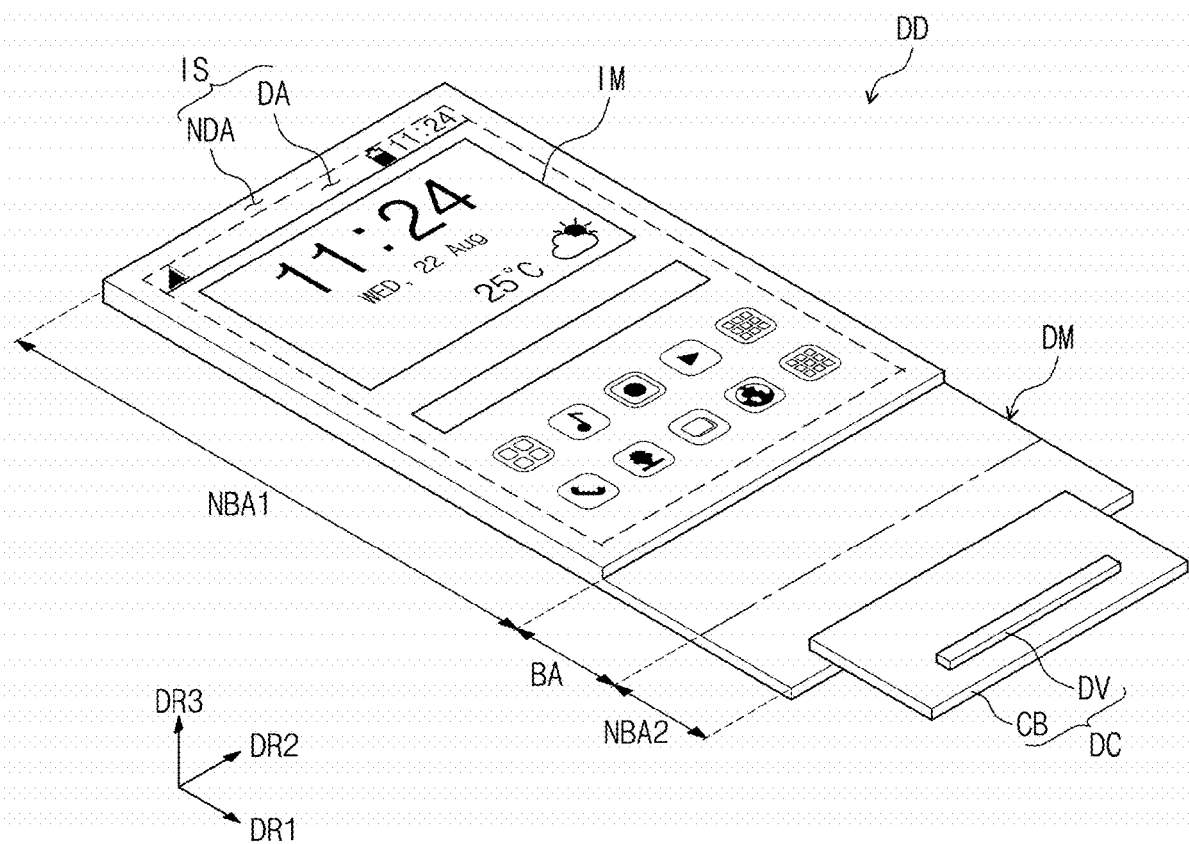
FIG. 1 is a perspective view illustrating a display apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In this specification, it will be understood that when an element such as a region, layer, or portion is referred to as being "on" another element, it can be directly on the other element or intervening elements may also be present.

In the drawings, the thicknesses, ratios, and dimensions of components are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms are relative concepts and described with respect to the direction indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
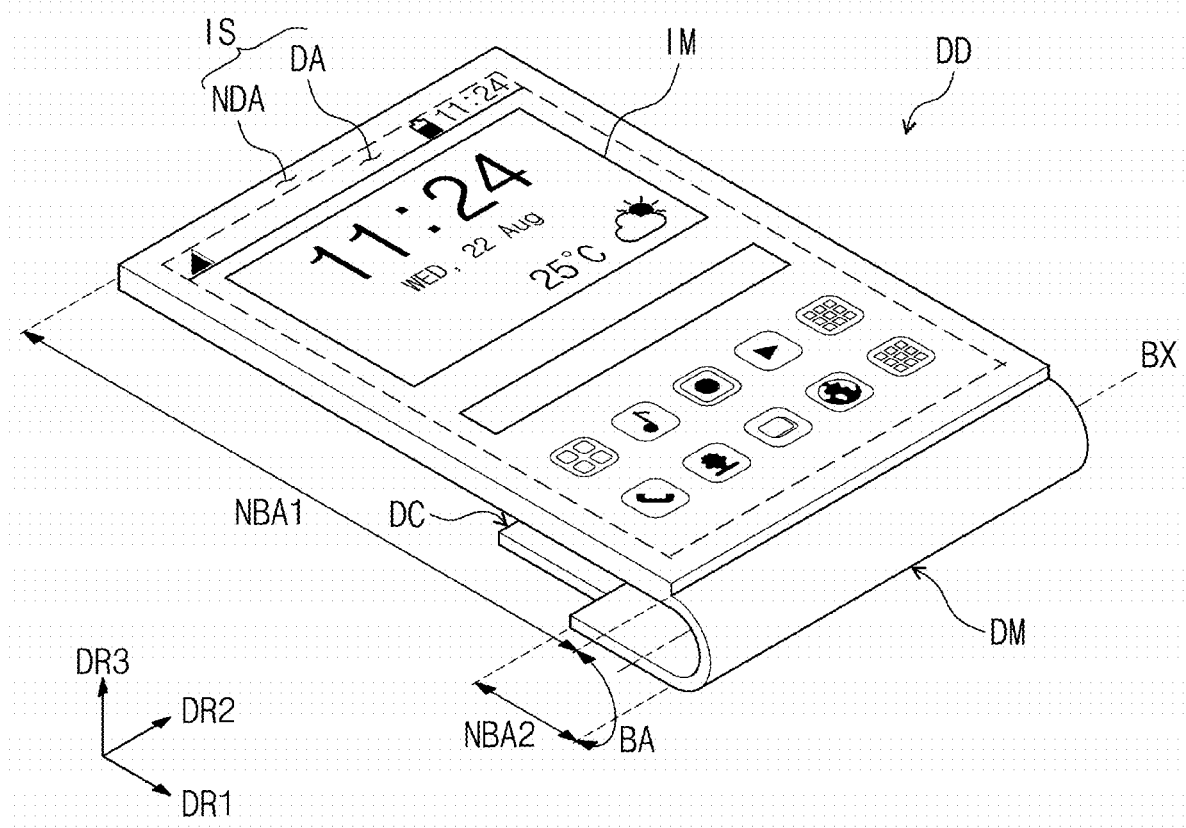
FIG. 2 is a perspective view illustrating a state in which a portion of the display apparatus in FIG. 1 is bent.

FIG. 1 is a perspective view illustrating a display apparatus according to an embodiment of the invention, and FIG. 2 is a perspective view illustrating a state in which a portion of the display apparatus in FIG. 1 is bent.

Figure 3:
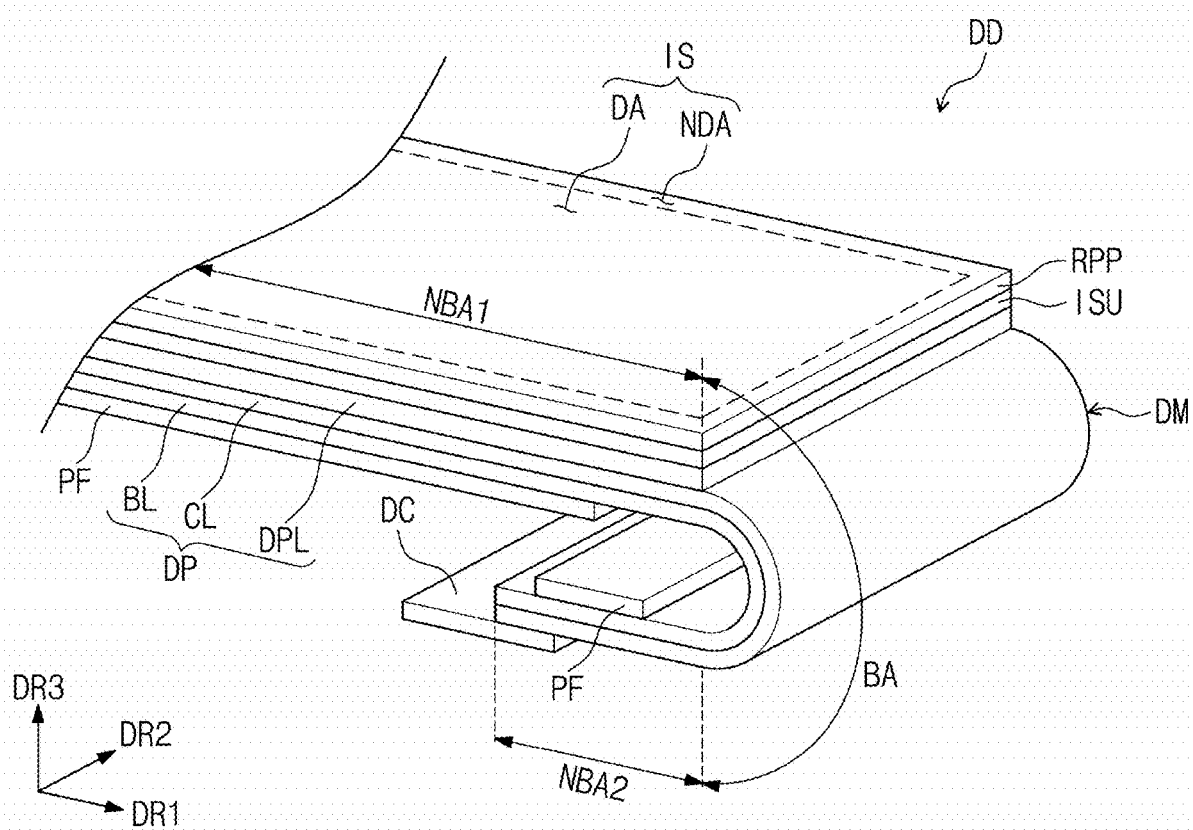
FIG. 3 is a cross-sectional view illustrating a cross-section of the display apparatus in FIG. 2.

FIG. 3 is a cross-sectional view illustrating the display apparatus in FIG. 2. FIG. 3 is a schematic view to show a lamination relationship between functional panels and/or functional units, which constitute a display apparatus DD.

Referring to FIGS. 1 to 3, an embodiment of the display apparatus DD according to the invention may have a rectangular shape having a long side in a first direction DR1 and a short side in a second direction DR2 perpendicular to the first direction DR1. Here, the shape of one embodiment of the display apparatus DD is described for convenience of description. However, the embodiment of the invention is not limited to the shape of the display apparatus DD described above.

The display apparatus DD may display an image IM through a display surface IS thereof. The display surface IS is parallel to a surface defined by the first direction DR1 and the second direction DR2. A normal direction of the display surface IS, i.e., a thickness direction of the display apparatus DD, is defined as a third direction DR3.

Hereinafter, a front surface (or top surface) and a rear surface (or bottom surface) of each of members or units are distinguished by the third directional axis DR3. However, directions indicated by the first to third directions DR1, DR2, and DR3 may be a relative concept and thus converted with respect to each other.

The display surface IS includes a display area DA, on which the image IM is displayed, and a non-display area NDA disposed adjacent to the display area DA. The display area DA is defined in a central area of the display apparatus DD. The non-display area NDA may be an area on which the image IM is not displayed. The non-display area NDA is defined to surround the display area DA on the display surface IS. In FIGS. 1 and 2, icon images are illustrated as one exemplary embodiment of the image IM displayed in the display area DA.

The display apparatus DD includes a display module DM and a circuit board DC. Display module DM displays the image. In such an embodiment, the display surface IS may be defined on a top surface of the display module DM.

A plurality of areas NBA1, BA, and NBA2, which are arranged in the first direction DR1 on a plane, may be defined on the display module DM. Herein, "on a plane" means when viewed from a plan view in third direction DR. Each of the plurality of areas NBA1, BA, and NBA2 may be variously defined according to an operation type of the display module DM.

In an embodiment, as shown in FIG. 1, a first area NBA1, a second area NBA2, and a third area BA disposed between the first area NBA1 and the second area NBA2 are defined on the display module DM on the plane. The first area NBA1 includes the display area DA and partially overlaps the non-display area NDA. The first area NBA1 is not bent or substantially flat.

The second area NBA2 is defined at one side (or defined by one side portion) of the display module DM in the first direction DR1. Herein, when a side is in a direction, the extending direction of the side is perpendicular to the direction. The second area NBA2 partially overlaps another portion of the non-display area NDA. The second area NBA2 is not bent or substantially flat. The second area NBA2 may be connected to the circuit board DC that will be described later in detail.

The third area BA is an area that is bent with respect to a bending axis BX parallel to the second direction DR2. The third area BA substantially forms a curvature. Hereinafter, the first area NBA1, the second area NBA2 and the third area BA may be referred to as a first non-bending area NBA1, a second non-bending area NBA2 and a bending area BA, respectively.

In an embodiment, as illustrated in FIG. 2, when the bending area BA of the display module DM is bent, a portion of the display module DM, which corresponds to the second non-bending area NBA2, may be disposed below a portion of the display module DM, which corresponds to the first non-bending area NBA1. In such an embodiment, the second non-bending area NBA2 may overlap a partial area of the first non-bending area NBA1 on the plane.

The first non-bending area NBA1 may have a first directional width different from that of the second non-bending area NBA2. Herein, "a directional width" means "a width measured in the direction." In an embodiment, the first non-bending area NBA1 may have the first directional width greater than that of the second non-bending area NBA2. Accordingly, when the display module DM is bent, the second non-bending area NBA2 may not be seen by overlapping the first non-bending area NBA1 on the plane.

In an embodiment, as shown in FIG. 3, the display module DM includes a display panel DP including a plurality of display elements (not shown), an input sensing layer ISU, a reflection preventing (or antireflection) layer RPP, and a protection member (or layer) PF.

The input sensing layer ISU is disposed on the display panel DP. The input sensing layer ISU entirely overlaps the display area DA. In one embodiment, for example, the input sensing layer ISU may overlap the first non-bending area NBA1.

The input sensing layer ISU may detect an external input (e.g., a touch) provided to the display apparatus DD.

In one embodiment, for example, the input sensing layer ISU may detect an external input that is inputted through a portion of a body (e.g., a fingertip) of a user. However, the embodiment of the invention is not limited to the method of inputting an external input. Alternatively, the external input may be inputted through a method such as an optical, contacting, or magnetic method.

Although not shown in the drawings, the input sensing layer ISU may include a plurality of input sensing electrodes (not shown) that detect an external input.

The input sensing layer ISU may detect the external input through various methods. In one embodiment, for example, the input sensing layer ISU may be driven in a method such as a capacitive method, a resistive film method, or a coordinate recognition method.

The reflection preventing layer RPP is disposed on the input sensing layer ISU. The reflection preventing layer RPP entirely overlaps the display area DA on a plane. In one embodiment, for example, the reflection preventing layer RPP may overlap the first non-bending area NBA1.

The reflection preventing layer RPP prevents external light, which is incident into the display apparatus DD from the outside, from being reflected by the display module, thereby preventing the reflected light from being seen to a user. Although not shown, the reflection preventing layer RPP may include a polarizing layer (not shown) and a phase retardation layer (not shown).

The polarizing layer has a transmission axis and an absorption axis perpendicular to the transmission axis. One element of elements of external light incident into the polarizing layer is absorbed or reflected by the absorption axis and not transmitted through the polarizing axis (not shown), and an element, which is perpendicular to the one element of elements of external light incident into the polarizing layer is transmitted through the polarizing layer. That is, the polarizing layer selectively polarizes external light.

In such an embodiment, the polarizing layer may include or be made of a polymer resin that is elongated in a specific direction. However, the embodiment of the invention is not limited to the kind of the polarizing layer. In an alternative embodiment of the invention, the polarizing layer may be a wire grid polarizer.

The phase retardation layer may be disposed below the polarizing layer. The phase retardation layer has optical anisotropy. Accordingly, the phase retardation layer may retard a phase of one element of incident light. That is, the phase retardation layer serves to change a polarization state of light. In one embodiment, for example, the phase retardation layer may retard one element of incident light by about λ/4. In such an embodiment, the phase retardation layer may be a quarter-wavelength film. Accordingly, as one element of the light passing through the phase retardation layer is retarded in phase, the light may be converted from a linear polarization state to a circular polarization state or from a circular polarization state to a linear polarization state.

According to such an embodiment, although the external light incident into the display apparatus DD from the outside is reflected by the display module DM, as the polarization state is changed by the phase retardation layer, the external light may be absorbed or reflected by the polarizing layer. Accordingly, the external light reflected by the display module DM may not be seen from the outside of the display apparatus DD.

Although the reflection preventing layer RPP may be disposed above the display panel DP as described above, the embodiment of the invention is not limited thereto. In one alternative embodiment, for example, the reflection preventing layer RPP may be disposed inside the display panel DP.

In another alternative embodiment of the invention, the input sensing layer ISU and the reflection preventing layer RPP may be omitted.

Although not shown in the drawing, the display module DM may further include a plurality of adhesive members (not shown). The adhesive members are disposed between the input sensing layer ISU and the reflection preventing layer RPP or between the display panel DP and the input sensing layer ISU to couple the input sensing layer ISU and the reflection preventing layer RPP or the display panel DP and the input sensing layer ISU to each other.

In an embodiment, as shown in FIG. 3, the protection member PF is disposed on a bottom surface of the display panel DP. The protection member PF overlaps the first non-bending area NBA1 and the second non-bending area NBA2. The protection member PF may include a first protection member PF and a second protection member PF, which are separated or spaced apart from each other. The first protection member PF and the second protection member PF overlap the first non-bending area NBA1 and the second non-bending area NBA2, respectively, and face each other in a bent state.

The circuit board DC is connected to one side of the display module DM in the first direction DR1. In an embodiment, the circuit board DC is connected to the first non-bending area NBA1 of the display module DM. In an embodiment, as shown in FIG. 1, the circuit board DC may include a flexible film CB and a driving circuit DV.

The flexible film CB is connected to the first non-bending area NBA1 of the display module DM. The flexible film CB may be electrically connected to the display module DM through an adhesive member (not shown). The adhesive member may include a transparent adhesive agent or an anisotropic conductive film.

The driving circuit DV may be disposed or mounted on the flexible film CB. The driving circuit DV is electrically connected to the flexible film CB through circuit lines (not shown) of the flexible film CB. The flexible film CB may electrically connect the driving circuit DV to the display panel DP, and the driving circuit DV may generate an electrical signal to be provided to the display panel DP or process an electrical signal provided from the display panel DP.

In an embodiment, although not shown in the drawing, the display apparatus DD may further include a window (not shown). The window may be disposed above the reflection preventing layer RPP. The window defines a front surface of the display apparatus DD and protects the reflection preventing layer RPP, the input sensing layer ISU and the display panel DP. In one embodiment, for example, the window may include a glass substrate, a sapphire substrate, or a plastic film. The window may have a multilayer or single-layer structure. In one embodiment, for example, the window may have a laminated structure in which a plurality of plastic films are coupled or stacked one on another by an adhesive agent or a laminated structure in which a glass substrate and a plastic film are coupled to each other by an adhesive agent.

Figure 4:
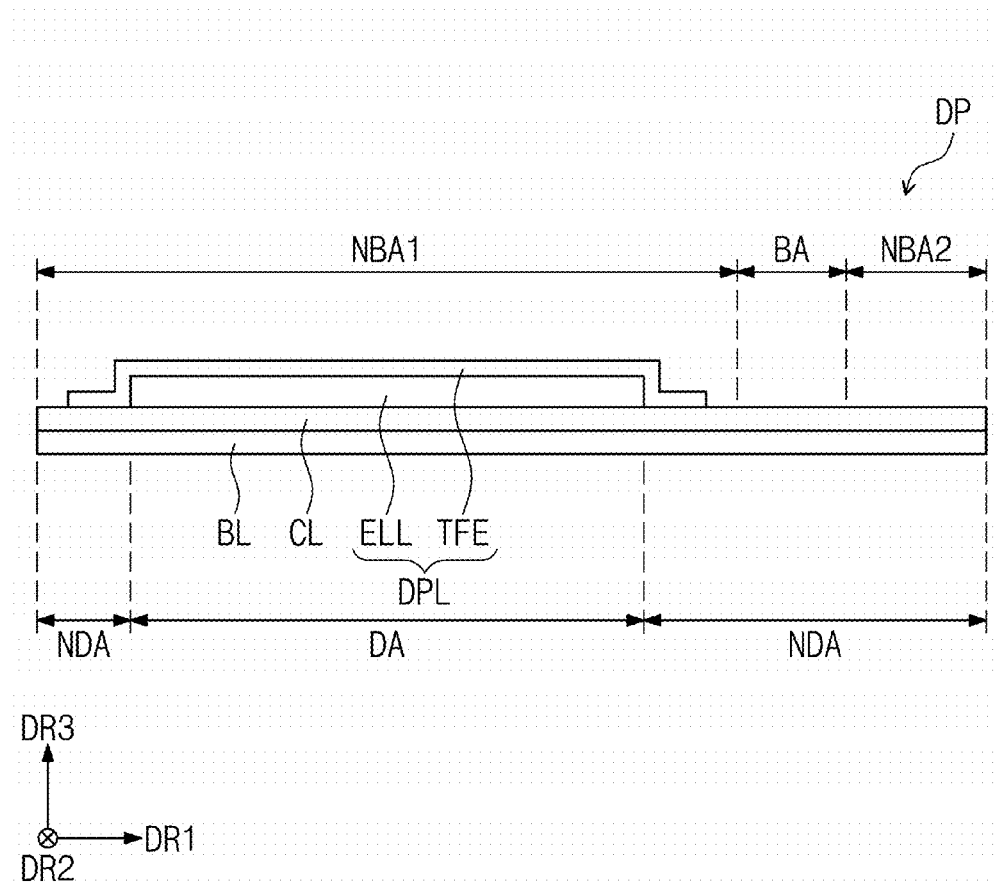
FIG. 4 is a cross-sectional view illustrating a display panel in FIG. 3.

FIG. 4 is a cross-sectional view illustrating the display panel in FIG. 3. FIG. 4 illustrates a cross-section defined by the first direction DR1 and the third direction DR3. FIG. 4 is a schematic view showing a lamination relationship between functional panels and/or functional units, which constitute/constitutes a display apparatus DD.

Referring to FIG. 4 in conjunction with FIG. 3, an embodiment of the display panel DP may be an organic light emitting display panel. In such an embodiment, a display element contained in the display panel DP may be an organic light-emitting diode OLED.

In an embodiment, as shown in FIG. 4, the display panel DP includes a base layer BL, a circuit layer CL, and a display layer DPL.

The base layer BL defines a rear surface of the display panel DP. The base layer BL includes or contains an insulating material. The base layer BL may include a metal substrate, a glass substrate, a plastic substrate, or an insulation film.

The circuit layer CL is disposed on the base layer BL. The circuit layer CL may include a plurality of thin-film transistors (not shown) for driving a plurality of organic light-emitting diodes OLED (refer to FIGS. 6 and 8), a plurality of signal lines (not shown), and a plurality of insulation layers (not shown).

The display layer DPL is disposed on the circuit layer CL. The display layer DPL is disposed on the first non-bending area NBA1. The display layer DPL includes a pixel layer ELL and an encapsulation layer TFE.

Figure 5:
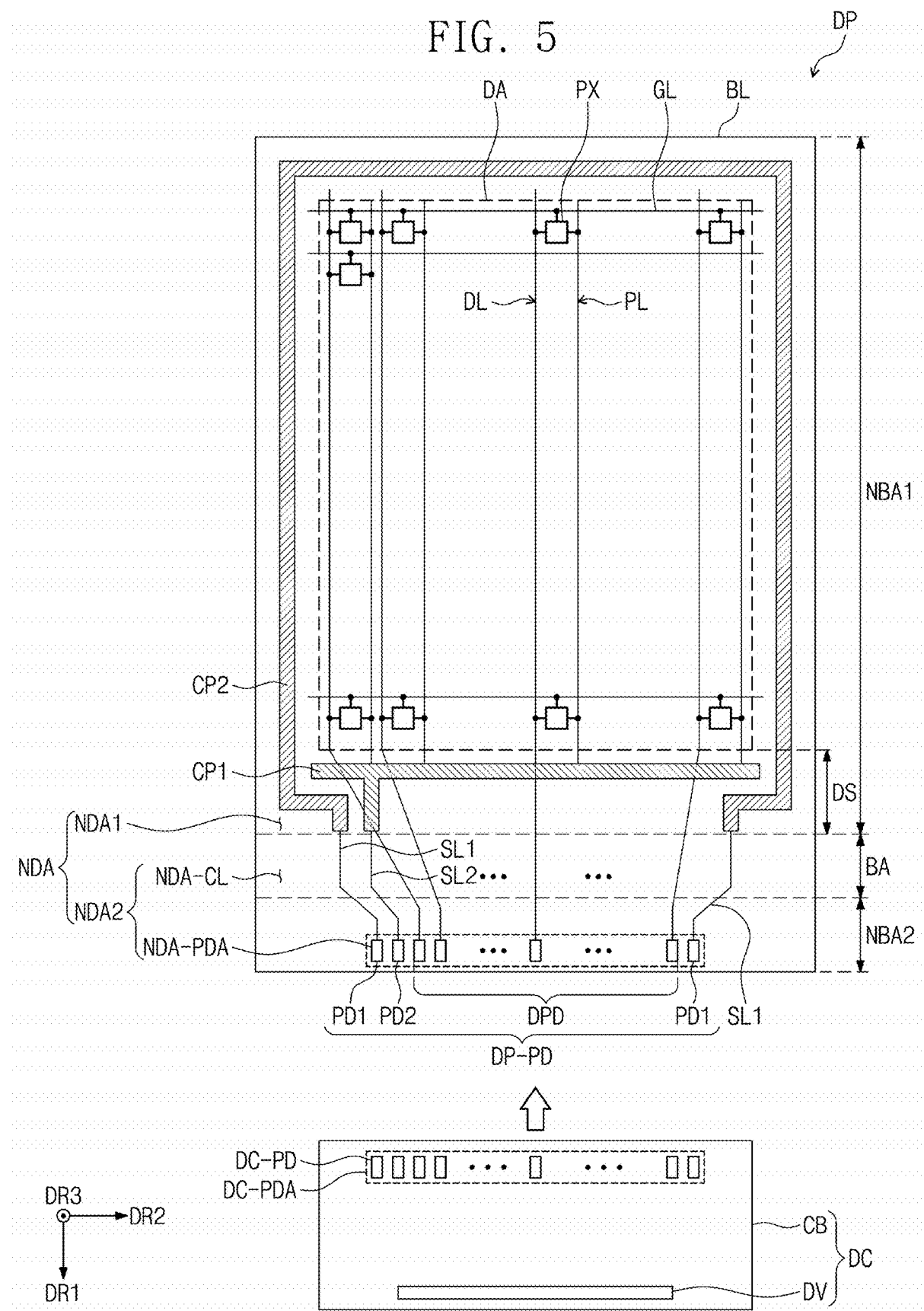
FIG. 5 is a plan view illustrating a display panel according to an embodiment of the invention.
Figure 6:
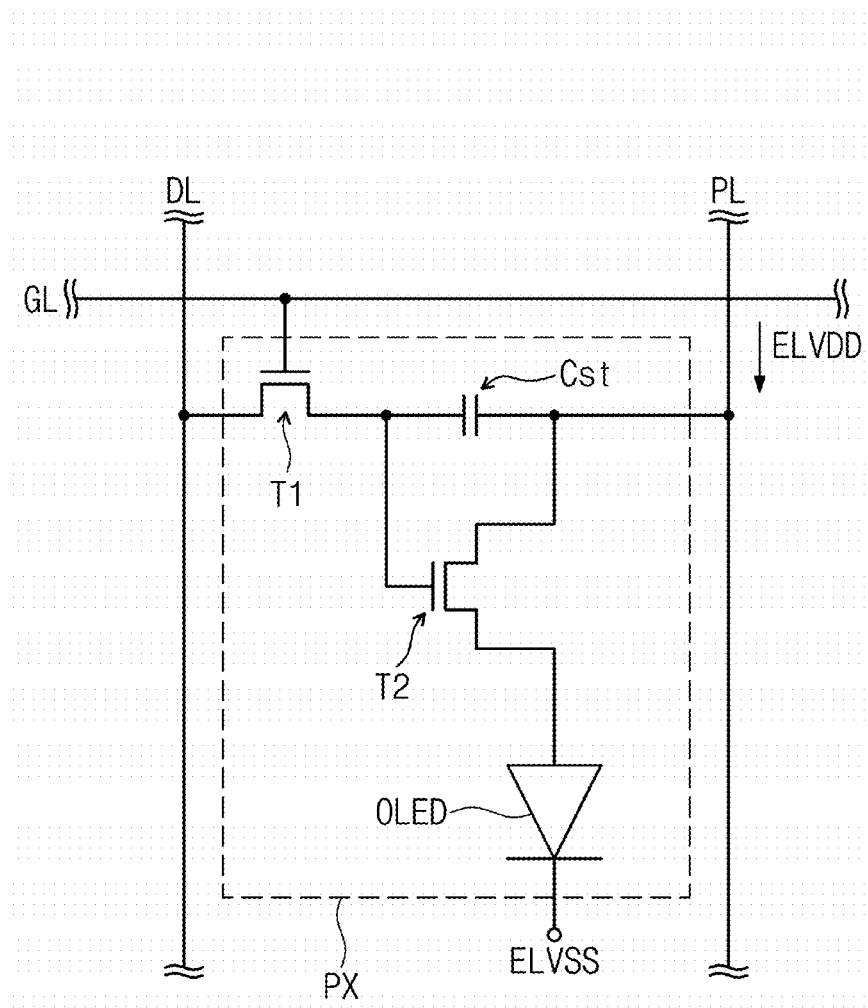
FIG. 6 is an equivalent circuit diagram illustrating a pixel according to an embodiment of the invention.

The pixel layer ELL includes the plurality of organic light-emitting diodes OLED (refer to FIGS. 6 and 8), a pixel defining layer 40 (refer to FIG. 8) sectioning the organic light-emitting diodes OLED (refer to FIGS. 6 and 8), One organic light-emitting diode OLED (refer to FIGS. 6 and 8) of the pixel layer ELL at least one thin-film transistor (not shown) of the circuit layer CL connected to the one organic light-emitting diode OLED (refer to FIGS. 6 and 8) may define one pixel PX (refer to FIGS. 5 and 6). In such an embodiment, the display panel DP includes a plurality of pixels PX (refer to FIGS. 5 and 6).

The encapsulation layer TFE is disposed on the pixel layer ELL to cover the pixel layer ELL. The encapsulation layer TFE seals the pixel layer ELL. The encapsulation layer TFE may include a plurality of laminated organic layers and/or inorganic layers. Alternatively, the encapsulation layer TFE may be a planarization layer providing a flat surface for layer therebelow or planarizing a top surface of the pixel layer ELL. However, the embodiment of the invention is not limited thereto. Alternatively, the encapsulation layer TFE may have a structure of various types.

The circuit layer CL and the display layer DPL will be described later in greater detail with reference to FIGS. 8 to 10.

FIG. 5 is a plan view illustrating the display panel according to an embodiment of the invention. FIG. 6 is a view illustrating a state in which the above-described circuit layer CL and pixel layer ELL are disposed on the base layer BL.

Referring to FIG. 5, as described above, an embodiment of the display panel DP includes the display area DA and the non-display area NDA on a plane. The non-display area NDA is defined along an edge of the display area DA to surround the display area DA.

In an embodiment, the non-display area NDA includes a first non-display area NDA1 and a second non-display area NDA2. The first non-display area NDA1 surrounds the display area DA. Conductive patterns CP1 and CP2, which will be described later, may be disposed on the first non-display area NDA1. In such an embodiment, the first non-display area NDA1 and the display area DA may entirely overlap the first non-bending area NBA1.

The second non-display area NDA2 is disposed adjacent to one side of the first non-display area NDA1 in the first direction DR1. The second non-display area NDA2 includes a line area NDA-CL and a panel pad area NDA-PDA.

The line area NDA-CL overlaps the bending area BA. In an embodiment, the line area NDA-CL may be the same as the bending area BA as shown in FIG. 5, but the embodiment of the invention is not limited thereto. Alternatively, the line area NDA-CL may be larger than the bending area BA on the display panel DP.

The panel pad area NDA-PDA is disposed on one side of the second non-display area NDA2 in the first direction DR1. The panel pad area NDA-PDA overlaps the second non-bending area NBA2.

On the plane, the display panel DP includes a plurality of conductive patterns CP1 and CP2, a plurality of signal lines DL, GL, PL, SL1, and SL2, a plurality of panel pads DP-PD, and a plurality of pixels PX.

The pixels PX are disposed on the display area DA. Each of the pixels PX includes an organic light-emitting diode and a pixel driving circuit connected thereto. The signal lines DL, GL, PL, SL1, and SL2, the plurality of conductive patterns CP1 and CP2, the plurality of panel pads DP-PD, and the pixel driving circuit may be disposed in the circuit layer CL in FIG. 4.

The signal lines DL, GL, PL, SL1, and SL2 are disposed over an entire area DA and NDA of the display panel DP. The signal lines DL, GL, PL, SL1, and SL2 include scanning lines GL, data lines DL, a power line PL, a first signal line SL1, and a second signal line SL2.

Each of the scanning lines GL is connected to a corresponding pixel PX of the pixels PX, and each of the data lines DL is connected to a corresponding pixel PX of the pixels PX. The power line PL is connected to each of the pixels PX. The first signal line SL1 is connected to the first conductive pattern CP1, and the second signal line SL2 is connected to the second conductive pattern CP2.

The conductive patterns CP1 and CP2 are disposed on the first non-display area NDA1. The conductive patterns CP1 and CP2 include a first conductive pattern CP1 and a second conductive pattern CP2. The first conductive pattern CP1 and the second conductive pattern CP2 are insulated with each other. In an embodiment, the first conductive pattern CP1 and the second conductive pattern CP2 are spaced apart from each other on the first non-display area NDA as shown in FIG. 5, but the embodiment of the invention is not limited thereto. Alternatively, the first conductive pattern CP1 and the second conductive pattern CP2 may be disposed on different layers from each other. In such an embodiment, the first conductive pattern CP1 and the second conductive pattern CP2 may overlap each other on the plane.

The first conductive pattern CP1 may be connected to the power lines PL extending from the display area DA. The power lines PL may be connected to one first conductive pattern CP1 and provide first power voltages ELVDD (refer to FIG. 6) having a same potential as each other to the pixels PX, respectively.

The second conductive pattern CP2 is connected to the organic light-emitting diode OLED to provide a second power signal. The second conductive pattern CP2 may provide second power voltages ELVSS (refer to FIG. 6) having a substantially same potential as each other to the pixels PX, respectively.

The plurality of panel pads DP-PD are disposed on the panel pad area NDA-PDA. The plurality of panel pads DP-PD include a first signal pad PD1, a second signal pad PD2, and a plurality of display signal pads DPD. The first signal pad PD1 is connected to the first signal line SL1. The second signal pad PD2 is connected to the second signal line SL2. The display signal pads DPD are connected to the corresponding data lines DL, respectively.

In such an embodiment, the signal lines DL, GL, and PL connected to the pixel PX constitute most of signal lines DL, GL, PL, SL1, and SL2. The signal lines DL, GL, and PL connected to the pixel PX is connected to transistors T1 and T2 (refer to FIG. 6) of the pixel PX. The signal lines DL, GL, and PL connected to the pixel PX may have a single-layer or multilayer structure and may have a single body or be divided into two or more portions. The two or more portions may be disposed on different layers from each other and connected to each other through a contact hole defined or extending through an insulation layer disposed between the two or more portions.

In FIG. 5, a circuit board DC that is electrically connected to the display panel DP is illustrated. A flexible board CB of the circuit board DC may include board pads DC-PD that are electrically connected to the display panel DP. In an embodiment, the board pads DC-PD is disposed in a board pad area DC-PDA defined on the flexible board CB. Although not shown, the flexible board CB may further include signal lines (not shown) that connect the board pads DC-PD to a driving circuit DV.

FIG. 6 is an equivalent circuit diagram illustrating a pixel according to an embodiment of the invention. FIG. 6, a corresponding scan line GL, a corresponding data line DL, a power line PL, and a pixel PX connected to the pixel are illustrated. However, the embodiment of the invention is not limited to the configuration of the pixel PX in FIG. 6. The configuration of the pixel PX may be variously modified.

Referring to FIG. 6, the organic light-emitting diode OLED may be a front light emitting element or a rear light emitting element. The pixel PX is a pixel driving circuit for driving the organic light-emitting diode OLED. The pixel PX includes a first transistor T1 (or switching transistor), a second transistor T2 (or driving transistor), and a capacitor Cst. The first power voltage ELVDD is provided to the second transistor T2, and the second power voltage ELVSS is provided to the organic light-emitting diode OLED. The second power voltage ELVSS may be less than the first power voltage ELVDD.

The first transistor T1 outputs a data signal applied to the data line DL in response to a scan signal applied to the scan line GL. The capacitor Cst charges a voltage corresponding to the data signal received from the first transistor T1. The second transistor T2 is connected to the organic light-emitting diode OLED. The second transistor T2 controls a driving current flowing through the organic light emitting diode OLED in correspondence to an electric charge stored in the capacitor Cst.

Although one embodiment of the equivalent circuit is illustrated in FIG. 6, the embodiment of the invention is not limited thereto. Alternatively, the pixel PX may further include three or more transistors and a plurality of capacitors. The organic light-emitting diode OLED may be connected between the power line PL and the second transistor T2.

Figure 7:
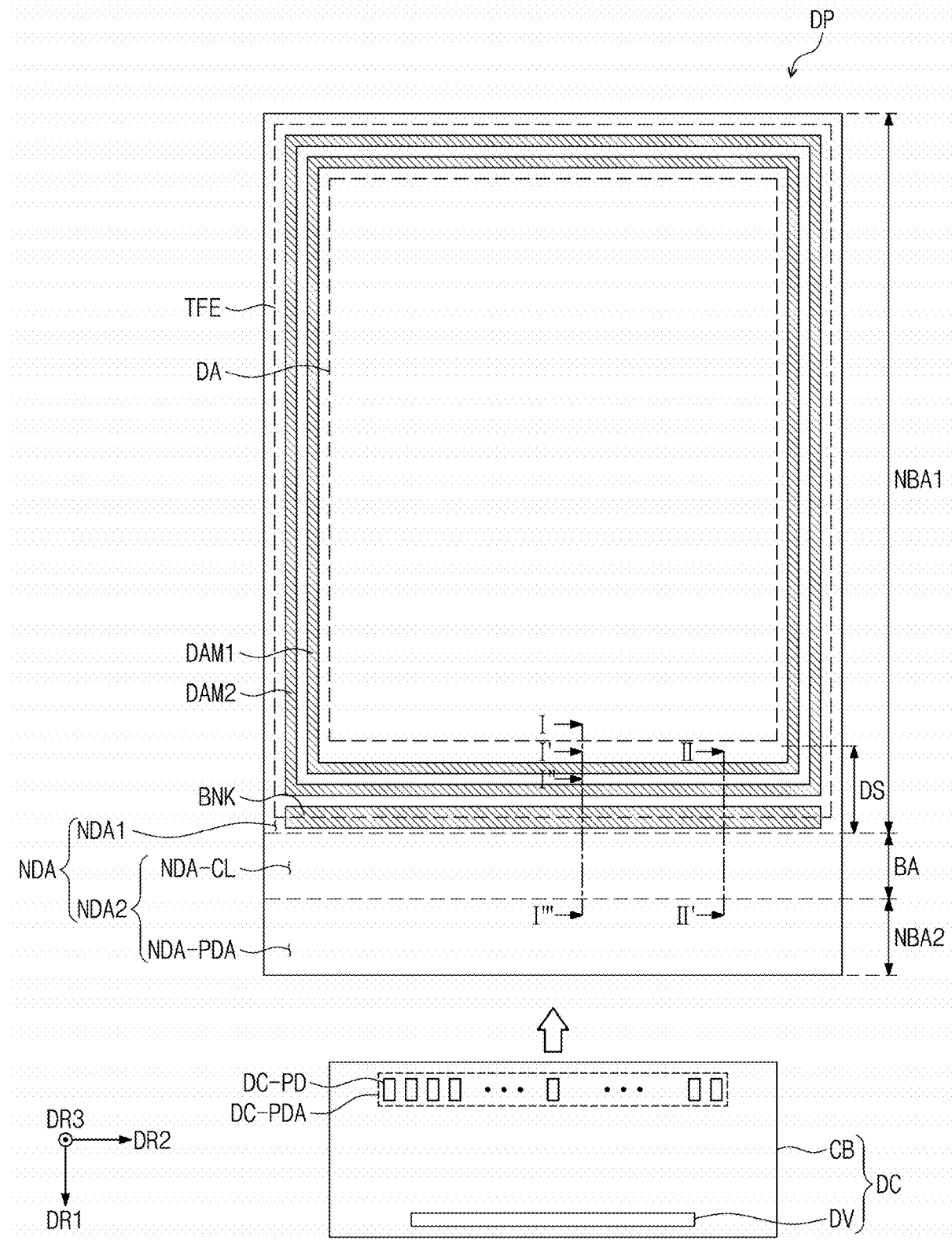
FIG. 7 is a plan view illustrating a display panel according to an embodiment of the invention.

FIG. 7 is a plan view illustrating the display panel according to an embodiment of the invention. FIG. 7 illustrates a state in which the encapsulation layer TFE is disposed on the base layer BL.

Referring to FIG. 7 in conjunction with FIG. 6, an embodiment of the display panel DP further includes a plurality of protruding members DAM1, DAM2, and BNK. The protruding members DAM1, DAM2, and BNK are disposed on the outside of the display area DA, i.e., the first non-display area NDA1. The protruding members DAM1, DAM2, and BNK are disposed to surround the display area DA.

The plurality of protruding members DAM1, DAM2, and BNK include a first dam DAM1, a second dam DAM2, and a bank BNK.

The first dam DAM1 has a frame shape that surrounds the display area DA on the plane. The second dam DAM2 is disposed on the outside of the first dam DAM1 on the plane. In such an embodiment, the first dam DAM1 is disposed relatively closer to the display area DA than the second dam DAM2. The second dam DAM2 has a frame shape that surrounds the first dam DAM1. The first dam DAM1 and the second dam DMA2 may prevent an organic monomer, which is applied to form an organic layer (e.g., OL in FIG. 8), from flooding to the outside from the display area DA.

In an embodiment, each of the first dam DAM1 and the second dam DAM2 has a frame shape as shown in FIG. 7, but the embodiment of the invention is not limited thereto. Alternatively, each of the first dam DAM1 and the second dam DAM2 may surround only at least one side of the display area DA.

The bank BNK is disposed on the outside of the second dam DAM2. In an embodiment, the bank BNK is disposed at one side of the second dam DMA2 in the first direction DR1. The bank BNK functions as a spacer that prevents a mask, which is used during a process of manufacturing the display panel DP and the input sensing layer ISU, from contacting components of the display panel DP and the input sensing layer ISU. In such an embodiment, the bank BNK may have a width in the first direction DR1, which is greater than that of each of the first dam DAM1 and the second dam DAM2.

In an embodiment, the bank BNK is disposed on only one side of the first non-display area NDA1 in the first direction DR1 as shown in FIG. 7, but the embodiment of the invention is not limited thereto. Alternatively, the bank BNK may be disposed on at least two edge portions of four edge portions defining the first non-display area NDA1.

According to an embodiment of the invention, at least a portion of one of the protruding members BNK, DAM1, and DAM2 may overlap a conductive pattern CP1 and CP2. In FIGS. 8 to 10, which will be described later, at least a portion of the first dam DAM1 overlaps the first conductive pattern CP1 on the plane.

Although not shown, an embodiment of the display panel DP may further include a crack dam (not shown) disposed on the first non-display area NDA1. The crack dam (not shown) may be disposed on the outside of the second dam DAM2. In one embodiment, for example, the crack dam (not shown) may be disposed on the outside of the second dam DAM2 in the second direction DR2 and have a shape extending in the first direction DR1 on the plane. When an external stimulus is applied, the crack dam (not shown) may perform a crack preventing function that absorbs an impact to prevent the impact from being transmitted toward the display area DA.

Figure 8:
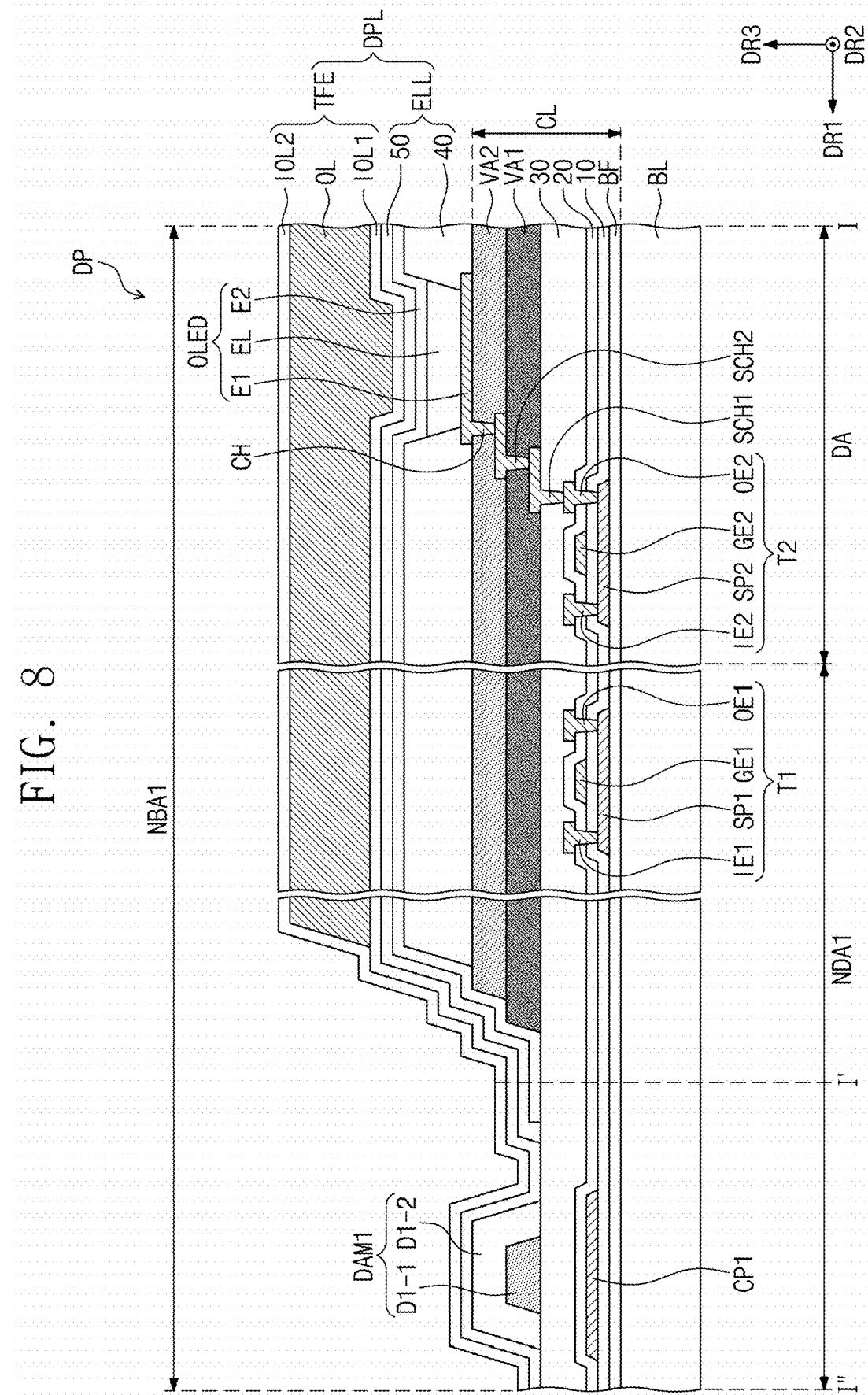
FIG. 8 is a cross-sectional view taken along line I-I" of FIG. 7.
Figure 9:
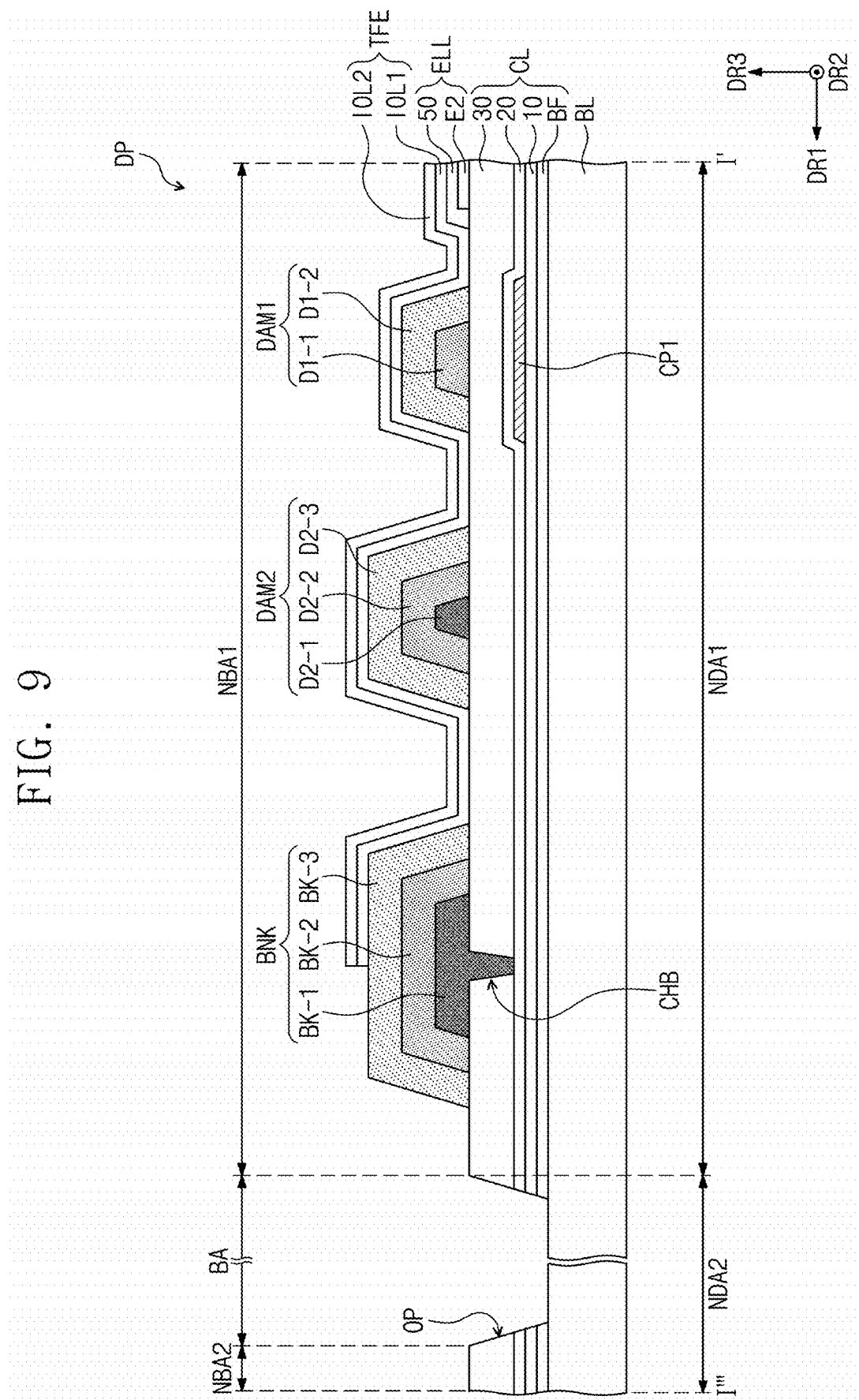
FIG. 9 is a cross-sectional view taken along line I'-I''' of FIG. 7.

FIG. 8 is a cross-sectional view taken along line I-I'', and FIG. 9 is a cross-sectional view taken along line I'-I'''. FIG. 10 is a cross-sectional view taken along line II-II' of FIG. 7.

Figure 10:
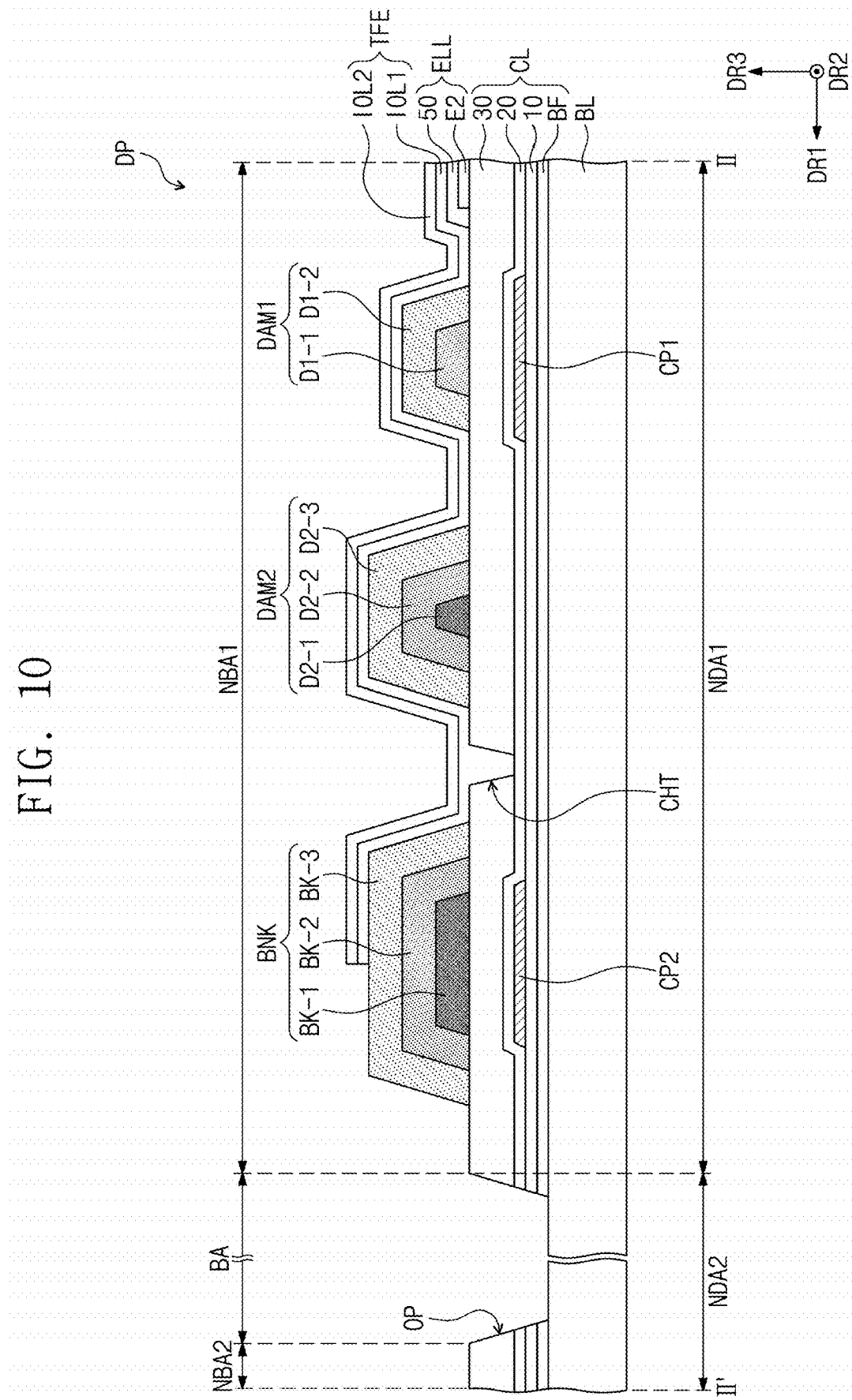
FIG. 10 is a cross-sectional view taken along line II-II' of FIG. 7.

Referring to FIGS. 8 to 10, the circuit layer CL, the pixel layer ELL, and the encapsulation layer TFE are sequentially disposed on the base layer BL.

In an embodiment, the circuit layer CL includes a plurality of insulation layers BF, 10, 20 and 30. The plurality of insulation layers BF, 10, 20 and 30 include a barrier layer BF that is an inorganic layer, a first intermediate insulation layer 10, a second intermediate insulation layer 20, and an upper insulation layer 30. Each of the barrier layer BF, the first intermediate insulation layer 10 and the second intermediate insulation layer 20 includes an inorganic material. The upper insulation layer 30 includes an inorganic material or an organic material. However, the embodiment of the invention is not particularly limited to a specific kind of the inorganic material or the organic material.

A semiconductor pattern SP1 (hereinafter, referred to as a first semiconductor pattern) of the first transistor T1 and a semiconductor pattern SP2 (hereinafter, referred to as a second semiconductor pattern) of the second transistor T2 are disposed on the barrier layer BF. Each of the first semiconductor pattern SP1 and the second semiconductor pattern SP2 may include at least one selected from amorphous silicon, poly-silicon and metal oxide semiconductor.

The first intermediate insulation layer 10 is disposed on the first semiconductor pattern SP1 and the second semiconductor pattern SP2. A control electrode GE1 (hereinafter, referred to as a first control electrode) of the first transistor T1 and a control electrode GE2 (hereinafter, referred to as a second control electrode) of the second transistor T2 are disposed on the first intermediate insulation layer 10.

The second intermediate insulation layer 20 covering the first control electrode GE1 and the second control electrode GE2 is disposed on the first intermediate insulation layer 10. An input electrode IE1 (hereinafter, referred to as a first input electrode) and an output electrode OE1 (hereinafter, referred to as a first output electrode) of the first transistor T1 and an input electrode IE2 (hereinafter, referred to as a second input electrode) and an output electrode OE2 (hereinafter, referred to as a second output electrode) of the second transistor T2 are disposed on the second intermediate insulation layer 20.

Each of the first input electrode IE1 and the first output electrode OE1 is connected to the first semiconductor pattern SP1 through a contact hole defined through the first intermediate insulation layer 10 and the second intermediate insulation layer 20. Each of the first input electrode IE1 and the first output electrode OE1 is connected to the first semiconductor pattern SP1 through a contact hole defined through the first intermediate insulation layer 10 and the second intermediate insulation layer 20.

Although each of the first transistor T1 and the second transistor T2 has a top gate structure in which the first and second control electrodes GE1 and GE2 are disposed above the first and second semiconductor patterns SP1 and SP2 in FIG. 8, the embodiment of the invention is not limited thereto. Alternatively, one of the first transistor T1 and the second transistor T2 may have a bottom gate structure.

The first input electrode IE1, the second input electrode IE2 and the upper insulation layer 30 covering the first input electrode IE1 and the second input electrode IE2 are disposed on the second intermediate insulation layer 20. The upper insulation layer 30 may provide a planarization surface.

In an embodiment, the circuit layer CL may include a plurality of via layers VA1 and VA2 and a plurality of connection electrodes SCH1 and SCH2.

The first via layer VA1 is disposed on the upper insulation layer 30. The first connection electrode SCH1 is disposed on the first via layer VA1. The first connection electrode SCH1 is connected to the second output electrode OE2 through the contact hole defined through the first via layer VA1.

The second via layer VA2 is disposed on the first via layer VA1. The second connection electrode SCH2 is disposed on the second via layer VA2. The second connection electrode SCH2 is connected to the first connection electrode SCH1 through the contact hole defined through the second via layer VA2.

In an alternative embodiment of the invention, the plurality of via layers VA1 and VA2 and the plurality of connection electrodes SCH1 and SCH2 may be omitted.

The display layer DPL is disposed on the second via layer VA2. In an embodiment, where the via layers VA1 and VA2 and the connection electrodes SCH1 and SCH2 are omitted, the display layer DPL may be disposed on the upper insulation layer 30.

The display layer DPL includes a pixel defining layer 40, an organic light-emitting diode OLED, and a protection layer 50.

The pixel defining layer 40 may include an organic material. A first electrode E1 is disposed on the second via layer VA2. The first electrode E1 is connected to the second connection electrode SCH2 through the contact hole CH defined through the second via layer VA2. In such an embodiment, the first electrode E1 is electrically connected to the second output electrode OE2 through the first connection electrode SCH1 and the second connection electrode SCH2. An opening is defined in the pixel defining layer 40. The opening of the pixel defining layer 40 exposes at least a portion of the first electrode E1. In an embodiment of the invention, the pixel defining layer 40 may be omitted.

A light emitting layer EL may be disposed in an area corresponding to the opening. In an embodiment, the light emitting layer EL may be patterned and separately provided in each of the pixels PX (refer to FIGS. 5 and 6). The light emitting layer EL may include an organic material and/or an inorganic material. The light emitting layer EL may generate color light having a predetermined color.

In an embodiment, the light emitting layer EL may be patterned into portions separated from each other to be disposed in the pixels PX, respectively, but the embodiment of the invention is not limited thereto. In one alternative embodiment, for example, the light emitting layer EL may be disposed in common on the pixels PX (refer to FIGS. 5 and 6). In such an embodiment, the light emitting layer EL may generate white-color light. In an embodiment, the light emitting layer EL may have a multilayer structure that is referred to as a tandem. Herein, "disposed in common on" may mean "integrally formed in a single unit to entirely cover."

The second electrode E2 is disposed on the light emitting layer EL. The second electrode E2 is disposed in common on the pixels PX (refer to FIGS. 5 and 6).

The protection layer 50 covers the second electrode E2.

The encapsulation layer TFE is disposed on the pixel layer ELL. In an embodiment, the encapsulation layer TFE is disposed on the protection layer 50. The encapsulation layer TFE is disposed in common on the pixels PX (refer to FIGS. 5 and 6). As illustrated in FIG. 7, the encapsulation layer TFE disposed on at least a portion of the display area DA and the first non-display area NDA1. That is, on the plane, an area occupied by the encapsulation layer TFE may be less than that occupied by the first non-bending area NBA1.

The encapsulation layer TFE includes a lower encapsulation layer IOL1, an organic layer OL, and an upper encapsulation layer IOL2. However, the embodiment of the invention is not limited thereto. In one embodiment, for example, the encapsulation layer TFE may further include an inorganic layer and an organic layer, and at least one of the lower encapsulation layer IOL1, the organic layer OL, and the upper encapsulation layer IOL2 may be omitted.

The lower encapsulation layer IOL1 is disposed on the pixel layer ELL to directly contact the pixel layer ELL. The lower encapsulation layer IOL1 may be an inorganic layer including an inorganic compound.

The organic layer OL is disposed on the lower encapsulation layer IOL1. The organic layer OL may contain an organic compound. The organic layer OL may have a thickness relatively greater than that of each of layers adjacent thereto. In one embodiment, for example, the organic layer OL may have a thickness greater than that of each of the lower encapsulation layer IOL1 and the upper encapsulation layer IOL2. The organic layer OL may serve as a protection layer for protecting the organic light-emitting diode OLED or serve as a planarization layer for planarizing a top surface.

The upper encapsulation layer IOL2 is disposed on the organic layer OL. The upper encapsulation layer IOL2 may be an inorganic layer including an inorganic compound. The upper encapsulation layer IOL2 may cover the organic layer OL to prevent the organic layer OL from contacting the outside. In such an embodiment, the upper encapsulation layer IOL2 may prevent moisture or the like generated from the organic layer OL from escaping to the outside.

In an embodiment, as shown in FIG. 9, the protruding members DAM1, DAM2, and BNK are disposed between the circuit layer CL and the encapsulation layer TFE. The lower encapsulation layer IOL1 and the upper encapsulation layer IOL2 are coupled to each other on the first non-display area NDA1 and cover the protruding members DAM1, DAM2, and BNK. In such an embodiment, as shown in FIG. 9. only a portion, which is adjacent to the display area DA, of the bank BNK of the protruding members DAM1, DAM2 and BNK may be covered by the lower encapsulation layer IOL1 and the upper encapsulation layer IOL2.

Each of the protruding members DAM1, DAM2, and BNK is disposed on the upper insulation layer 30 in a partial area of the first non-display area NDA1, on which the via layers VA1 and VA2 are not disposed.

Each of the protruding members DAM1, DAM2, and BNK may include a plurality of layers. In one embodiment, for example, the first dam DAM1 may be configured by laminating two layers D1-1 and D1-2, and the second dam DAM2 may be configured by laminating three layers D2-1, D2-2, and D2-3. The bank BNK may be configured by laminating three layers BK-1, BK-2, and BK-3. In an embodiment, as shown in FIGS. 9 and 10, an opening OP may be defined through a portion of the upper insulation layer 30, a portion of the second intermediate insulation layer 20 and a portion of the barrier layer BF, which are in the bending area BA on the plane.

In an embodiment, as illustrated in FIG. 9, a bank coupling hole CHB defined through the upper insulation layer 30 may be defined in the first non-display area NDA1 disposed adjacent to the bending area BA. In such an embodiment, a portion of a top surface of the second intermediate insulation layer 20 may be exposed by the bank coupling hole CHB.

The bank coupling hole CHB overlaps the bank BNK on the plane. The bank BNK may be filled in the bank coupling hole CHB. In one embodiment, for example, a first portion BK-1 that is a lowermost portion of the bank BNK may be filled in the bank coupling hole CHB. In such an embodiment, the second intermediate insulation layer 20 and the bank BNK may be coupled to each other through the bank coupling hole CHB.

In an embodiment, as illustrated in FIG. 10, the bank coupling hole CHB is not defined in an area in which the bank BNK overlaps one CP1 of conductive patterns CP1 and CP2. The bank coupling hole CHB is insulated with the conductive patterns CP1 and CP2. That is, the bank coupling hole CHB according to the embodiment may be defined only in an area that overlaps the bank BNK while non-overlapping the conductive patterns CP1 and CP2.

In such an embodiment, an encapsulation coupling hole CHT defined through the upper insulation layer 30 may be defined in the first non-display area NDA1 disposed adjacent to the bending area BA. In such an embodiment, a portion of the top surface of the second intermediate insulation layer 20 may be exposed by the encapsulation coupling hole CHT.

The encapsulation coupling hole CHT is defined between the bank BNK and the second dam DAM2 on the plane. However, the embodiment of the invention is not limited thereto. Alternatively, although not shown in the drawing, the encapsulation coupling hole CHT may be defined between the second dam DAM2 and the first dam DAM1 on the plane.

At least the lower encapsulation layer IOL1 of the lower encapsulation layer IOL1 and the upper encapsulation layer IOL2 may be filled in the encapsulation coupling hole CHT. In such an embodiment, the second intermediate insulation layer 20 and the encapsulation layer TFE may be coupled to each other through the encapsulation coupling hole CHT.

According to an embodiment of the invention, as the bank coupling hole CHB is defined in the first non-bending area NBA1 disposed adjacent to the bending area BA, a contact area between the circuit layer CL and the bank BNK may increase. In such an embodiment, a coupling force between the circuit layer CL and the bank BNK may increase.

In an embodiment, as the encapsulation coupling hole CHT is defined in the first non-bending area NBA1 disposed adjacent to the bending area BA, a contact area between the circuit layer CL and the encapsulation layer TFE may increase. In such an embodiment, a coupling force between the circuit layer CL and the encapsulation layer TFE may increase.

Hereinafter, for convenience of description, a partial area of the first non-bending area NBA1 or the first non-display area NDA1 defined between the bending area BA and the display area DA is defined as a dead space DS (refer to FIGS. 5 and 7). According to an embodiment of the invention, the dead space DS may have a width of about 400 micrometers (μm) or less in the first direction DR1.

In a conventional display device, where the coupling holes CHB and CHT are not defined on the dead space DS, as the display panel DP is bent, a bending stress may be applied in a direction toward the display area DA from the bending area BA. In this case, a crack may occur in the display area DA, or delamination may occur in each of the base layer BL, the circuit layer CL, and the display layer DPL. In particular, as the width of the dead space DS in the first direction DR1 decreases, the bending stress applied to the display area DA may remarkably increase. However, according to an embodiment of the invention, the coupling holes CHB and CHT are defined in the dead space DS, such that coupling forces between the bank BNK and the circuit layer CL and between the encapsulation layer TFE and the circuit layer CL increase. Accordingly, even when the bending area BA of the display panel DP is bent, a phenomenon in which a crack occurs in the display area DA or delamination occurs in each of the base layer BL, the circuit layer CL and the display layer DPL may be relieved or substantially reduced. In such an embodiment, even when the bending area BA of the display panel DP is bent, the coupling hole CHB and CHT may absorb the bending stress transmitted to the display area DA from the bending area BA. In such an embodiment, the durability of the display apparatus DD may be improved.

According to an embodiment of the invention, each of the coupling holes CHB and CHT may have a width in the first direction DR1, which is differently set according to a size of the display panel DP and a width of the dead space DS in the first direction DR1. As the width of each of the coupling holes CHB and CHT in the first direction increases, an absorbed amount of the bending stress transmitted to the display area DA may increase. When the dead space DS has a width of about 400 μm or less in the first direction DR1, for example, each of the coupling holes CHB and CHT may have a width of about 5 μm or more and about 200 μm or less in the first direction DR1. However, the embodiment of the invention is not particularly limited to the width of each of the coupling holes CHB and CHT in the first direction DR1.

Figure 11:
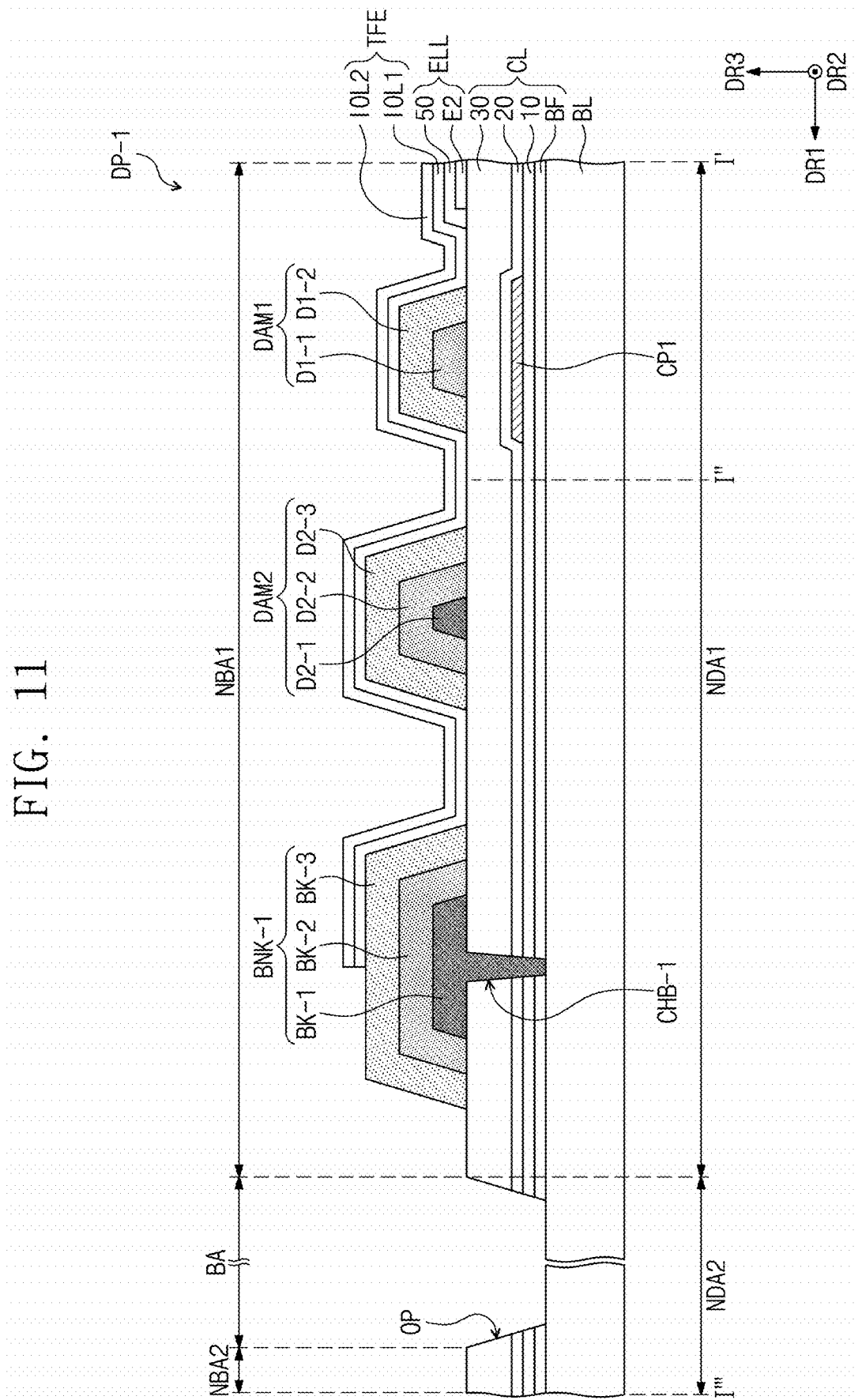
FIG. 11 is a cross-sectional view illustrating a display panel according to an alternative embodiment of the invention.

FIG. 11 is a cross-sectional view illustrating a display apparatus according to an alternative embodiment of the invention.

The cross-sectional view in FIG. 11 is substantially the same as the cross-sectional view shown in FIG. 9 except for the bank coupling hole CHB-1. The same or like elements shown in FIG. 11 have been labeled with the same reference characters as used above to describe the exemplary embodiments of display apparatus shown in FIG. 9, and any repetitive detailed description thereof will hereinafter be omitted or simplified.

Referring to FIG. 11, the bank coupling hole CHB-1 of a display panel DP-1 may have a width deeper than that of the bank coupling hole CHB described in FIG. 9.

In such an embodiment, the bank coupling hole CHB-1 may be defined through an upper insulation layer 30, intermediate insulation layers 10 and 20, and a barrier layer BF. In such an embodiment, a portion of a top surface of a base layer BL may be exposed by the bank coupling hole CHB-1. The bank coupling hole CHB-1 overlaps a bank BNK-1 on the plane. The bank BNK-1 may be filled in the bank coupling hole CHB-1. In such an embodiment, the base layer BL and the bank BNK-1 may be connected to each other through the bank coupling hole CHB-1.

According to an embodiment, a contact area between the circuit layer CL and the bank BNK-1 may further increase by the bank coupling hole CHB-1.

Figure 12:
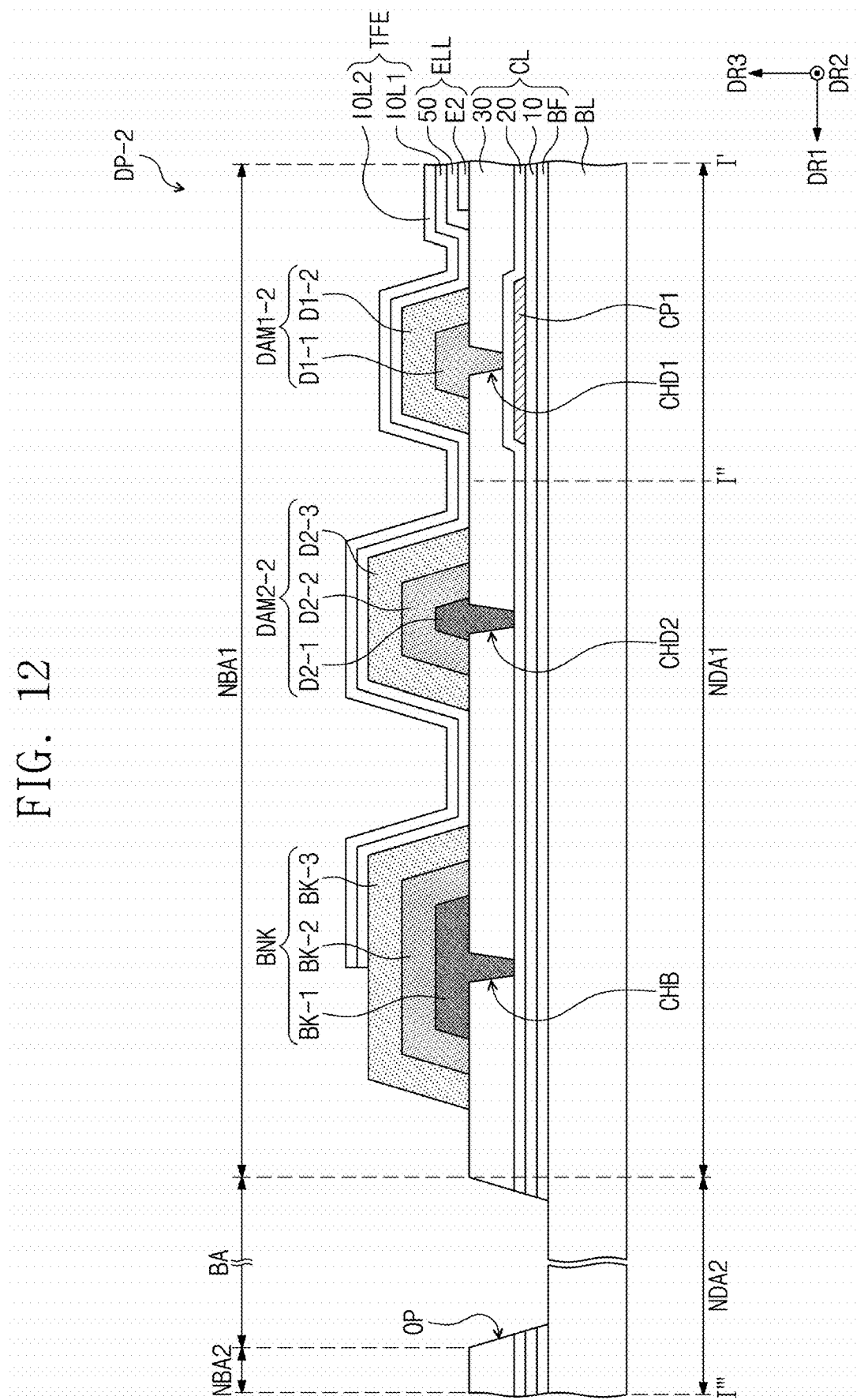
FIG. 12 is a cross-sectional view illustrating a display panel according to another alternative embodiment of the invention.

FIG. 12 is a cross-sectional view illustrating a display apparatus according to another alternative embodiment of the invention.

The cross-sectional view in FIG. 12 is substantially the same as the cross-sectional view shown in FIG. 9 except for dan coupling holes CHD1 and CHD2. The same or like elements shown in FIG. 12 have been labeled with the same reference characters as used above to describe the exemplary embodiments of display apparatus shown in FIG. 9, and any repetitive detailed description thereof will hereinafter be omitted or simplified.

Referring to FIG. 12, a display panel DP-2 includes a dam coupling hole, e.g., a first dam coupling hole CHD1 and a second dam coupling hole CHD2.

In an embodiment, as shown in FIG. 12, the first dam coupling hole CHD1 or the second dam coupling hole CHD2, which is defined or extends through an upper insulation layer 30, may be defined in a first non-display area NDA1 disposed adjacent to a bending area BA. In such an embodiment, a portion of a top surface of a second intermediate insulation layer 20 may be exposed by the first dam coupling hole CHD1 or the second dam coupling hole CHD2.

The first dam coupling hole CHD1 overlaps a first dam DAM1-2. The first dam DAM1-2 may be filled in the first dam coupling hole CHD1. In one embodiment, for example, a first portion D1-1 that is a lowermost portion of the first dam DAM1-2 may be filled in the first dam coupling hole CHD1. That is, the second intermediate insulation layer 20 and the first dam DAM1-2 may be coupled to each other through the first dam coupling hole CHD1. The first dam coupling hole CHD1 is insulated with a first conductive pattern CP1 by the second intermediate insulation layer 20.

The second dam coupling hole CHD2 overlaps a second dam DAM2-2. The second dam DMA2-2 may be filled in the second dam coupling hole CHD2. In one embodiment, for example, a first portion D2-1 that is a lowermost portion of the second dam DAM2-2 may be filled in the second dam coupling hole CHD2. In such an embodiment, the second intermediate insulation layer 20 and the second dam DAM2-2 may be coupled to each other through the second dam coupling hole CHD2.

Figure 13:
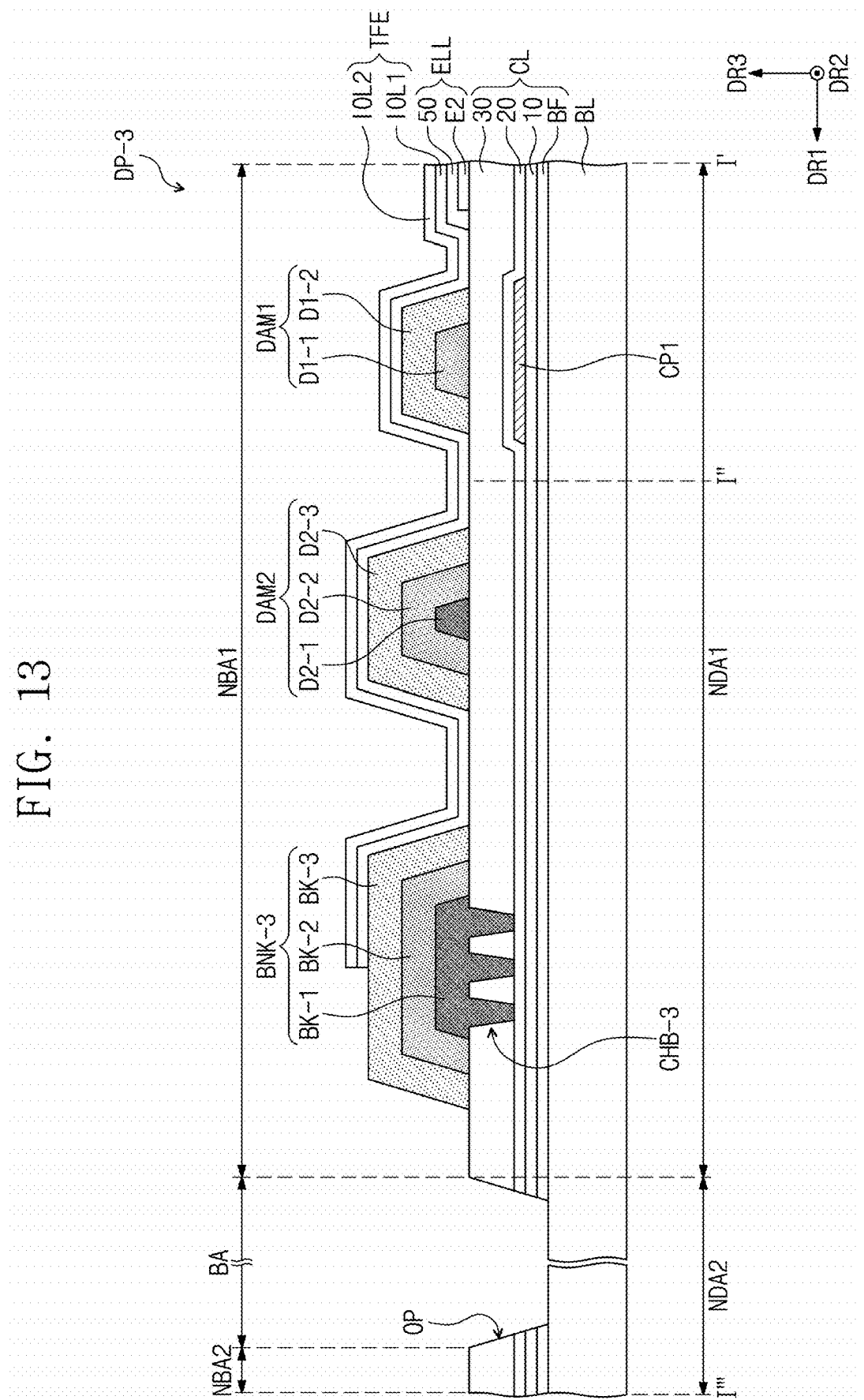
FIG. 13 is a cross-sectional view illustrating a display panel according to another alternative embodiment of the invention.

FIG. 13 is a cross-sectional view illustrating a display panel according to another embodiment of the invention.

The cross-sectional view in FIG. 13 is substantially the same as the cross-sectional view shown in FIG. 9 except for the bank coupling hole CHB-3. The same or like elements shown in FIG. 13 have been labeled with the same reference characters as used above to describe the exemplary embodiments of display apparatus shown in FIG. 9, and any repetitive detailed description thereof will hereinafter be omitted or simplified.

Referring to FIG. 13, in an embodiment, a bank coupling hole CHB-3 of a display panel DP-3 may be provided in plurality.

In such an embodiment, a plurality of bank coupling holes CHB-3 defined through an upper insulation layer 30 may be defined in a first non-display area NDA1 disposed adjacent to a bending area BA. The plurality of bank coupling holes CHB-3 overlap a bank BNK-3 on the plane. The bank BNK-3 and a second intermediate insulation layer 20 may be coupled to each other through the bank coupling holes CHB-3.

According to an embodiment, as the bank coupling hole CHB-3 is provided in plurality, a contact area between a circuit layer CL and the bank BNK-3 may further increase.

Figure 14:
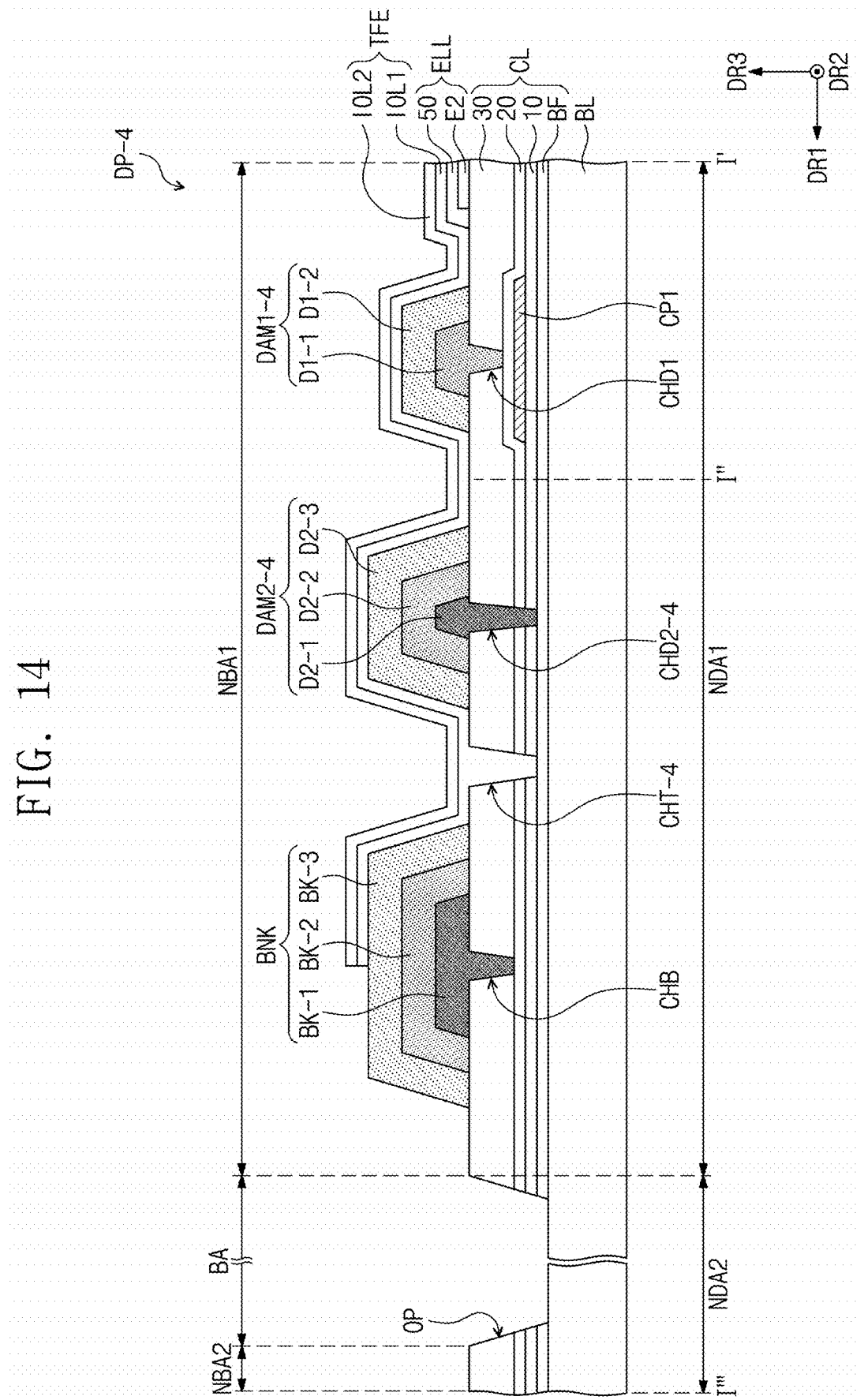
FIG. 14 is a cross-sectional view illustrating a display panel according to another alternative embodiment of the invention.

FIG. 14 is a cross-sectional view illustrating a display panel according to another embodiment of the invention.

The cross-sectional view in FIG. 14 is substantially the same as the cross-sectional view shown in FIG. 9 except for an encapsulation coupling hole CHT-4 or a dam coupling hole CHD2-4. The same or like elements shown in FIG. 14 have been labeled with the same reference characters as used above to describe the exemplary embodiments of display apparatus shown in FIG. 12, and any repetitive detailed description thereof will hereinafter be omitted or simplified.

Referring to FIG. 14, in an embodiment, an encapsulation coupling hole CHT-4 or a dam coupling hole CHD2-4 of a display panel DP-4 may expose a portion of the barrier layer BF.

In such an embodiment, the encapsulation coupling hole CHT-4 may be defined or extend through an upper insulation layer 30 and intermediate insulation layers 10 and 20. In such an embodiment, a portion of a top surface of a barrier layer BF may be exposed by the encapsulation coupling hole CHT-4.

In an embodiment, the dam coupling hole CHB2-4 may be defined or extend through the upper insulation layer 30 and the intermediate insulation layers 10 and 20. In such an embodiment, a portion of a top surface of the barrier layer BF may be exposed by the encapsulation coupling hole CHT-4.

In an embodiment, as shown in FIG. 14, a first dam DAM1-4 overlaps a first conductive pattern CP1, and a second dam DAM2-4 non-overlaps the first conductive pattern CP1, such that only the second dam coupling hole CHD2-4 is defined to expose the barrier layer BF. According to an alternative embodiment of the invention, when the second dam DAM2-4 overlaps the conductive patterns CP1 and CP2, and the first dam DAM1-4 non-overlaps the conductive patterns CP1 and CP2, only the second dam coupling hole CHD2-4 may expose the barrier layer BF.

According to embodiments of the invention, the display apparatus may improve in durability.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:
1. A display apparatus comprising:
   a base layer, on which a display area and a non-display area surrounding the display area are defined;
   a circuit layer disposed on the base layer and comprising a plurality of insulation layers;
   a pixel layer disposed on the display area and comprising a plurality of organic light-emitting diodes;

an encapsulation layer disposed on the pixel layer to cover the pixel layer; and a protruding member disposed between the circuit layer and the encapsulation layer on the non-display area, wherein a bank coupling hole is defined in the circuit layer on the non-display area, wherein the bank coupling hole is defined through at least an upper insulation layer of the plurality of insulation layers and overlaps the protruding member on a plane, and wherein the plurality of insulation layers comprises:

a plurality of intermediate insulation layers disposed on the base layer; and the upper insulation layer disposed on the plurality of intermediate insulation layers, and wherein the bank coupling hole is defined through the upper insulation layer to expose a portion of at least one of the plurality of the intermediate insulation layers, and the protruding member is in direct contact with at least one of the plurality of intermediate insulation layers and the base layer through the bank coupling hole.

2. The display apparatus of claim 1, wherein the protruding member is provided in plural, and the protruding member comprises:

a dam disposed to surround the display area; and a bank disposed on an outside of the dam in a first direction, and the bank coupling hole overlaps the bank on the plane, wherein the first direction corresponds to an extending direction of a long side of the display area.

3. The display apparatus of claim 2, wherein the circuit layer further comprises:

a barrier layer disposed on the base layer;

a plurality of thin-film transistors disposed on the barrier layer; and a plurality of conductive patterns disposed on the barrier layer in the non-display area, and the plurality of intermediate insulation layers are disposed on the barrier layer, and the upper insulation layer covers the thin-film transistors and the conductive patterns.

4. The display apparatus of claim 3, wherein the bank and at least one of the intermediate insulation layers is coupled to each other through the bank coupling hole.

5. The display apparatus of claim 4, wherein an encapsulation coupling hole is defined through at least the upper insulation layer on the non-display area, and the encapsulation coupling hole is defined between the bank and the dam on the plane.

6. The display apparatus of claim 5, wherein the encapsulation coupling hole is defined through the upper insulation layer and the intermediate insulation layer, and the encapsulation layer and the barrier layer are coupled to each other through the encapsulation coupling hole.

7. The display apparatus of claim 3, wherein the bank coupling hole is defined through the upper insulation layer, the plurality of intermediate insulation layers and the barrier layer, and the bank and the base layer are coupled to each other through the bank coupling hole.

8. The display apparatus of claim 7, wherein the bank coupling hole does not overlap the plurality of conductive patterns on the plane, and is insulated with the conductive patterns.

9. The display apparatus of claim 3, wherein the circuit layer comprises a dam coupling hole defined through at least the upper insulation layer on the non-display area, and the dam coupling hole overlaps the dam on the plane.

10. The display apparatus of claim 9, wherein the dam coupling hole overlaps at least a portion of the plurality of conductive patterns on the plane, and is insulated with the conductive patterns.

11. The display apparatus of claim 9, wherein the dam coupling hole is defined through the upper insulation layer and the plurality of intermediate insulation layers, and the dam and the barrier layer are coupled to each other through the dam coupling hole.

12. The display apparatus of claim 11, wherein the dam coupling hole does not overlap the plurality of conductive patterns on the plane, and is insulated with the conductive patterns.

13. The display apparatus of claim 3, wherein the dam is provided in plural, the dam comprises: a first dam having a frame shape surrounding the display area on the plane; and a second dam having a frame shape surrounding the first dam on the plane, and at least one of the first dam and the second dam overlaps the plurality of conductive patterns.

14. The display apparatus of claim 2, wherein the non-display area comprises a bending area, which is bent with respect to a bending axis perpendicular to the first direction on the plane.

15. The display apparatus of claim 14, wherein a distance between the display area and the bending area in the first direction is about 400 μm or less.

16. The display apparatus of claim 15, wherein the bank coupling hole has a first directional width of about 5 μm or more and about 200 μm or less.

17. The display apparatus of claim 2, wherein the bank coupling hole is provided in plural.

18. The display apparatus of claim 2, wherein the bank has a first directional width greater than a first directional width of the dam.

19. A display apparatus comprising:

a base layer, on which a display area and a non-display area surround the display area are defined;

a circuit layer disposed on the base layer;

a display layer disposed on the circuit layer; and a plurality of protruding members disposed on the circuit layer on the non-display area, wherein the circuit layer comprises:

a plurality of insulation layers, wherein a coupling hole is defined through at least one upper insulation layer of the plurality of insulation layers in the non-display area; and a plurality of conductive patterns disposed between the plurality of insulation layers, wherein at least one of the plurality of protruding members is filled in the coupling hole, wherein the plurality of insulation layers comprises:

a plurality of intermediate insulation layers disposed on the base layer; and the upper insulation layer disposed on the plurality of intermediate insulation layers, the coupling hole is defined through the upper insulation layer to expose a portion of at least one of the plurality of the intermediate insulation layers, and at least one of plurality of the protruding members is in direct contact with at least one of the plurality of intermediate insulation layers and the base layer through the coupling hole.

20. A display apparatus comprising:
a display panel, on which a display area for displaying an image and a non-display area surround the display area are defined, wherein at least a portion of the non-display area is bent, wherein the display panel comprises:
a base layer;
a circuit layer disposed on the base layer and comprising a plurality of insulation layers;
a pixel layer disposed on the display area;
an encapsulation layer disposed on the pixel layer to cover the pixel layer; and
a bank disposed between the circuit layer and the encapsulation layer on the non-display area, and
wherein a bank coupling hole is defined in the circuit layer on a partial area disposed adjacent to a bending area in the non-display area,
wherein the bank coupling hole is defined through at least an upper insulation layer of the plurality of insulation layers, and
wherein a lower portion of the bank is filled in the bank coupling hole,
wherein the plurality of insulation layers comprises:
a plurality of intermediate insulation layers disposed on the base layer; and
an upper insulation layer disposed on the plurality of intermediate insulation layers,
the bank coupling hole is defined through the upper insulation layer to expose a portion of the plurality of intermediate insulation layers, and
a protruding member is in direct contact with at least one of the plurality of intermediate insulation layers and the base layer through the bank coupling hole.

* * * * *